United States Patent
Kang et al.

(10) Patent No.: US 9,847,276 B2
(45) Date of Patent: Dec. 19, 2017

(54) SEMICONDUCTOR DEVICES HAVING THROUGH-ELECTRODES AND METHODS FOR FABRICATING THE SAME

(71) Applicants: Pil-Kyu Kang, Anyang-si (KR); Byung Lyul Park, Seoul (KR); SungHee Kang, Seongnam-si (KR); Taeseong Kim, Suwon-si (KR); Taeyeong Kim, Suwon-si (KR); Kwangjin Moon, Hwaseong-si (KR); Jae-Hwa Park, Yongin-si (KR); Sukchul Bang, Yongin-si (KR); Seongmin Son, Hwaseong-si (KR); Jin Ho An, Seoul (KR); Ho-Jin Lee, Seoul (KR); Jeonggi Jin, Seoul (KR)

(72) Inventors: Pil-Kyu Kang, Anyang-si (KR); Byung Lyul Park, Seoul (KR); SungHee Kang, Seongnam-si (KR); Taeseong Kim, Suwon-si (KR); Taeyeong Kim, Suwon-si (KR); Kwangjin Moon, Hwaseong-si (KR); Jae-Hwa Park, Yongin-si (KR); Sukchul Bang, Yongin-si (KR); Seongmin Son, Hwaseong-si (KR); Jin Ho An, Seoul (KR); Ho-Jin Lee, Seoul (KR); Jeonggi Jin, Seoul (KR)

(73) Assignee: SAMSUNG ELECTRONICS CO., LTD. (KR)

(*) Notice: Subject to any disclaimer, the term of this patent is extended or adjusted under 35 U.S.C. 154(b) by 102 days.

(21) Appl. No.: 14/463,645

(22) Filed: Aug. 19, 2014

(65) Prior Publication Data
US 2015/0137326 A1 May 21, 2015

(30) Foreign Application Priority Data
Nov. 20, 2013 (KR) .................... 10-2013-0141569

(51) Int. Cl.
*H01L 29/40* (2006.01)
*H01L 23/48* (2006.01)
*H01L 21/768* (2006.01)

(52) U.S. Cl.
CPC ........ *H01L 23/481* (2013.01); *H01L 21/7682* (2013.01); *H01L 21/76898* (2013.01); *H01L 2924/0002* (2013.01)

(58) Field of Classification Search
CPC ............... H01L 21/76898; H01L 23/4821
(Continued)

(56) References Cited

U.S. PATENT DOCUMENTS 6,707,157 B2  3/2004  Hoshino
7,098,476 B2  8/2006  Babich et al.
(Continued)

FOREIGN PATENT DOCUMENTS

| JP | 2013065615 A | 4/2013 |
| KR | 20110067759 A | 6/2011 |
| KR | 101109053 B1 | 1/2012 |

OTHER PUBLICATIONS

Machine translation of Takesako et al., JP 2013-065615, Apr. 11, 2013.*

(Continued)

*Primary Examiner* — Hsin-Yi Hsieh
(74) *Attorney, Agent, or Firm* — Renaissance IP Law Group LLP

(57) ABSTRACT

A semiconductor device includes a semiconductor substrate having a top surface and a bottom surface facing each other, an interlayer dielectric layer provided on the top surface of the semiconductor substrate and including an integrated circuit, an inter-metal dielectric layer provided on the interlayer dielectric layer and including at least one metal interconnection electrically connected to the integrated circuit, (Continued)

an upper dielectric layer disposed on the inter-metal dielectric layer, a through-electrode penetrating the inter-metal dielectric layer, the interlayer dielectric layer, and the semiconductor substrate, a via-dielectric layer surrounding the through-electrode and electrically insulating the through-electrode from the semiconductor substrate. The via-dielectric layer includes one or more air-gaps between the upper dielectric layer and the interlayer dielectric layer.

14 Claims, 20 Drawing Sheets

(58) Field of Classification Search
USPC .......................................................... 257/621
See application file for complete search history.

(56) References Cited

U.S. PATENT DOCUMENTS

| 7,911,048 | B2 | 3/2011 | Murayama |
|---|---|---|---|
| 7,919,835 | B2 | 4/2011 | Akiyama |
| 8,164,165 | B2 | 4/2012 | Chang et al. |
| 2002/0027293 | A1 | 3/2002 | Hoshino |
| 2005/0037604 | A1 | 2/2005 | Babich et al. |
| 2007/0090490 | A1 | 4/2007 | Chang et al. |
| 2008/0315367 | A1 | 12/2008 | Murayama |
| 2009/0152602 | A1 | 6/2009 | Akiyama |
| 2012/0139127 | A1 | 6/2012 | Beyne |
| 2012/0153500 | A1 | 6/2012 | Kim et al. |
| 2012/0211885 | A1 | 8/2012 | Choi et al. |
| 2012/0217611 | A1 | 8/2012 | Liu et al. |
| 2012/0292782 | A1 | 11/2012 | Lee et al. |

OTHER PUBLICATIONS

Farooq et al., "3D Copper TSV Integration, Testing and Reliability," IBM Corporation, Semiconductor Research & Development Center, Hopewell Junction, NY, 12533, USA, 2011 IEEE, 7.1.1-7.1.4, IEDM11-143-IEDM11-146.

* cited by examiner

SEMICONDUCTOR DEVICES HAVING THROUGH-ELECTRODES AND METHODS FOR FABRICATING THE SAME

CROSS-REFERENCE TO RELATED APPLICATION

This U.S. non-provisional patent application claims priority under 35 U.S.C. §119 to Korean Patent Application No. 10-2013-0141569, filed on Nov. 20, 2013, in the Korean Intellectual Property Office, the disclosure of which is hereby incorporated by reference in its entirety.

BACKGROUND

The inventive concepts relate to a semiconductor and, more particularly, to semiconductor devices having through-electrodes and methods for fabricating the same.

Through-electrodes penetrate a substrate of a semiconductor device to electrically connect the semiconductor device to another semiconductor device or a printed circuit board. The through-electrodes may be used for three-dimensional mounting techniques. The through-electrodes may realize faster transmission speed than conventional solder balls or solder bumps. Electrical characteristics of semiconductor devices may be deteriorated by expansion of through-electrodes or thermal stress. Thus, new structures or new manufacturing methods of through-electrodes are required in order to improve electrical characteristics of semiconductor devices.

SUMMARY

Embodiments of the inventive concepts may provide semiconductor devices capable of preventing an inter-metal dielectric layer from being damaged by expansion of through-electrodes or thermal stress and methods for fabricating the same.

In one aspect, a semiconductor device may include: a semiconductor substrate having a top surface and a bottom surface facing each other; an interlayer dielectric layer provided on the top surface of the semiconductor substrate, the interlayer dielectric layer including an integrated circuit; an inter-metal dielectric layer provided on the interlayer dielectric layer, the inter-metal dielectric layer including at least one metal interconnection electrically connected to the integrated circuit; an upper dielectric layer disposed on the inter-metal dielectric layer; a through-electrode penetrating the inter-metal dielectric layer, the interlayer dielectric layer, and the semiconductor substrate; and a via-dielectric layer surrounding the through-electrode and electrically insulating the through-electrode from the semiconductor substrate. The via-dielectric layer may include one or more air-gaps between the upper dielectric layer and the interlayer dielectric layer.

In some embodiments, the through-electrode may fill a via-hole penetrating the inter-metal dielectric layer, the interlayer dielectric layer, and the semiconductor substrate. The via-dielectric layer may extend along an inner sidewall of the via-hole.

In some embodiments, the via-dielectric layer may include a plurality of protrusions inserted into the inter-metal dielectric layer, and the protrusions may include the air-gaps.

In some embodiments, the inter-metal dielectric layer may include a plurality of low-k dielectric layers stacked on the interlayer dielectric layer in a direction perpendicular to the top surface of the semiconductor substrate. The low-k dielectric layer may have a dielectric constant lower than that of silicon dioxide. The protrusions may protrude toward the low-k dielectric layers in a direction parallel to the top surface of the semiconductor substrate.

In some embodiments, the inter-metal dielectric layer may further include a plurality of insulating capping layers provided between the plurality of low-k dielectric layers. The air-gaps may be spaced apart from each other with the capping layers therebetween in the direction perpendicular to the top surface of the semiconductor substrate.

In some embodiments, the semiconductor device may further include: an upper interconnection disposed on the upper dielectric layer. The through-electrode may further penetrate the upper dielectric layer and is connected to the upper interconnection.

In some embodiments, the semiconductor device may further include: an upper terminal disposed on the upper dielectric layer. The upper terminal may penetrate the upper dielectric layer and may be connected to the metal interconnection electrically connected to the through-electrode.

In some embodiments, the inter-metal dielectric layer may include a plurality of low-k dielectric layers stacked on the interlayer dielectric layer in a direction perpendicular to the top surface of the semiconductor substrate. The low-k dielectric layer may have a dielectric constant lower than that of silicon dioxide. The low-k dielectric layers may include recess regions extending from the via-dielectric layer in a direction parallel to the top surface of the semiconductor substrate.

In some embodiments, the recess regions may be partially filled with the via-dielectric layer, and the recess regions may include the air-gaps which are defined by spaces incompletely filled with the via-dielectric layer.

In some embodiments, the inter-metal dielectric layer may further include a plurality of insulating capping layers provided between the plurality of low-k dielectric layers, and the recess regions may be spaced apart from each other with the capping layers therebetween in the direction perpendicular to the top surface of the semiconductor substrate.

In another aspect, a semiconductor device may include: a semiconductor substrate having a top surface and a bottom surface facing each other; an interlayer dielectric layer provided on the top surface of the semiconductor substrate, the interlayer dielectric layer including an integrated circuit; an inter-metal dielectric layer provided on the interlayer dielectric layer, the inter-metal dielectric layer including at least one metal interconnection electrically connected to the integrated circuit; a through-electrode penetrating the inter-metal dielectric layer, the interlayer dielectric layer, and the semiconductor substrate; and a via-dielectric layer surrounding the through-electrode, the via-dielectric layer electrically insulating the through-electrode from the semiconductor substrate. The via-dielectric layer may include a porous dielectric layer including one or more voids between the inter-metal dielectric layer and the through-electrode.

In some embodiments, the inter-metal dielectric layer may include a plurality of low-k dielectric layers stacked on the interlayer dielectric layer in a direction perpendicular to the top surface of the semiconductor substrate, and the low-k dielectric layer may have a dielectric constant lower than that of silicon dioxide.

In some embodiments, the low-k dielectric layers may include recess regions extending from the via-dielectric layer in a direction parallel to the top surface of the semiconductor substrate, and the recess regions may include the voids.

In some embodiments, the inter-metal dielectric layer may further include insulating capping layers provided between the plurality of low-k dielectric layers.

In still another aspect, a fabricating method may include: providing a substrate in which an integrated circuit is included; forming an inter-metal dielectric layer in which metal interconnections are included; forming a via-hole vertically penetrating the inter-metal dielectric layer and the substrate; selectively removing a sidewall of the inter-metal dielectric layer exposed through the via-hole to form a plurality of recess regions vertically spaced apart from each other; forming a via-dielectric layer covering an inner surface of the via-hole; and forming a through-electrode in the via-hole, the through-electrode surrounded by the via-dielectric layer. The via-dielectric layer may partially fill the recess region, and the recess region may include an air-gap defined by a space incompletely filled with the via-dielectric layer.

In some embodiments, forming the inter-metal dielectric layer may include: alternately stacking insulating capping layers and low-k dielectric layers on the substrate. The low-k dielectric layer may have a dielectric constant lower than that of silicon dioxide.

In some embodiments, forming the recess regions may include: performing a wet etching process using an etchant capable of selectively removing the low-k dielectric layers. The recess regions may be vertically spaced apart from each other with the capping layer therebetween.

In some embodiments, the capping layers may include SiCN, and the low-k dielectric layers may include SiCOH.

In some embodiments, the etchant may include hydrofluoric acid (HF).

In some embodiments, providing the substrate may include: providing a semiconductor substrate having a top surface and a bottom surface opposite the top surface; and forming an interlayer dielectric layer including the integrated circuit on the top surface of the semiconductor substrate.

BRIEF DESCRIPTION OF THE DRAWINGS

The inventive concepts will become more apparent in view of the attached drawings and accompanying detailed description.

DETAILED DESCRIPTION OF THE EMBODIMENTS

Figure 1A:
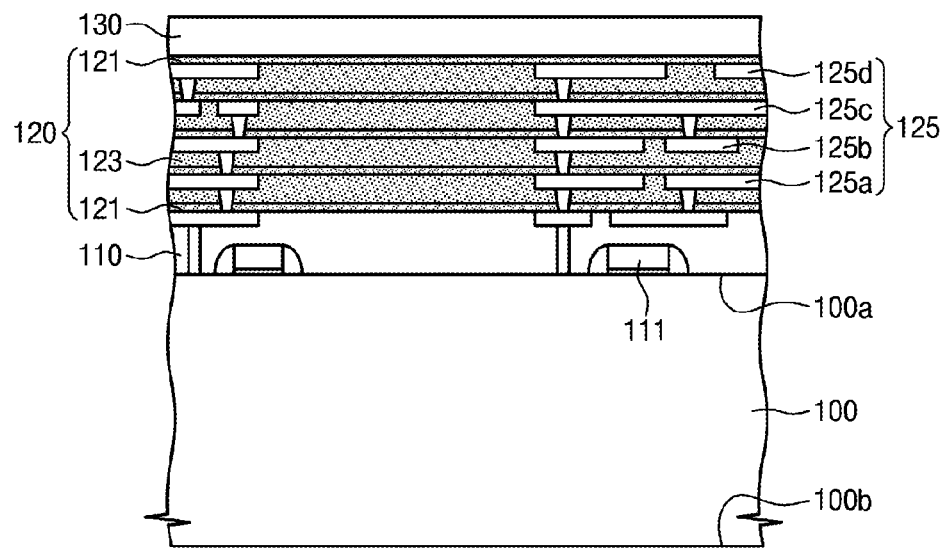
FIGS. 1A to 1I are cross-sectional views illustrating a method for fabricating a semiconductor device according to some embodiments of the inventive concepts.

The inventive concepts will now be described more fully hereinafter with reference to the accompanying drawings, in which exemplary embodiments of the inventive concepts are shown. The advantages and features of the inventive concepts and methods of achieving them will be apparent from the following exemplary embodiments that will be described in more detail with reference to the accompanying drawings. It should be noted, however, that the inventive concepts are not limited to the following exemplary embodiments, and may be implemented in various forms. Accordingly, the exemplary embodiments are provided only to disclose the inventive concepts and let those skilled in the art know the category of the inventive concepts. In the drawings, embodiments of the inventive concepts are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concepts. Accordingly, shapes of the exemplary views may be modified according to manufacturing techniques and/or allowable errors. Therefore, the embodiments of the inventive concepts are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concepts.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concepts explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

First Embodiment

FIGS. 1A to 1I are cross-sectional views illustrating a method for fabricating a semiconductor device according to some embodiments of the inventive concepts. FIG. 1J is a cross-sectional view illustrating a modified embodiment of FIG. 1I. FIGS. 2A to 2D are cross-sectional views illustrating a method of forming an air-gap. FIGS. 2E to 2I are cross-sectional views illustrating various shapes of an air-gap.

Referring to FIG. 1A, a semiconductor substrate 100 may be provided. The semiconductor substrate 100 may have a top surface 100a and a bottom surface 100b facing each other. An interlayer dielectric (ILD) layer 110 and an inter-metal dielectric (IMD) layer 120 may be sequentially formed on the top surface 100a of the semiconductor substrate 100. The interlayer dielectric layer 110 may include an integrated circuit 111, and the inter-metal dielectric layer 120 may include a metal interconnection 125. An upper dielectric layer 130 may be further formed to cover the inter-metal dielectric layer 120. The semiconductor substrate 100 may be a wafer including a semiconductor such as silicon. The integrated circuit 111 may include a memory circuit, a logic circuit, or any combination thereof. At least one of the interlayer dielectric layer 110 and the upper dielectric layer 130 may include a silicon oxide layer or a silicon nitride layer. For example, at least one of the interlayer dielectric layer 110 and the upper dielectric layer 130 may include a tetraethylorthosilicate (TEOS) oxide layer formed by a chemical vapor deposition (CVD) process.

The inter-metal dielectric layer 120 may include a low-k or ultra low-k dielectric having a dielectric constant lower than that of silicon dioxide ($SiO_2$). For example, the inter-metal dielectric layer 120 may include a silicon-based polymeric dielectric (e.g., fluorine-doped silicon dioxide, carbon-doped silicon dioxide, porous silicon dioxide, hydrogen silsesquioxane (HSG), or methylsilsesquioxane (MSG)), an organic polymeric dielectric (e.g., polyimide), SiCOH, SiLK™ of Dow chemical company, or AURORA™ of ASM international company.

In some embodiments, the metal interconnection 125 may have a multi-layered structure. Thus, the inter-metal dielectric layer 120 may have a multi-layered structure. For example, the metal interconnection 125 may have a multi-layered structure having first to fourth metal interconnections 125a, 125b, 125c and 125d which are vertically stacked and are electrically connected to the integrated circuit 110. The inter-metal dielectric layer 120 may include a plurality of dielectric layers 123 provided between the first to fourth metal interconnections 125a to 125d. The dielectric layers 123 may be formed of the low-k or ultra low-k dielectric. For example, the dielectric layers 123 may include an ultra low-k porous dielectric (e.g., SiCOH).

The four metal interconnections 125a to 125d are described as an example. In other words, the number of the metal interconnections 125a to 125d is not limited to four. In other embodiments, the number of the stacked metal interconnections may be greater than or smaller than 4. Hereinafter, the dielectric layer 123 is defined as a low-k dielectric layer for the purpose of ease and convenience in explanation. The low-k dielectric layer may include the low-k dielectric or the ultra-k dielectric.

In some embodiments, the inter-metal dielectric layer 120 may further include insulating capping layers 121 capable of preventing a metal element of the metal interconnection 125 from being diffused. The capping layers 121 may include a low-k dielectric (e.g., SiCN). The capping layers 121 may be provided between the low-k dielectric layers 123, between a lowermost low-k dielectric layer 123 and the interlayer dielectric layer 110, and/or between an uppermost low-k dielectric layer 123 and the upper dielectric layer 130.

Figure 1B:
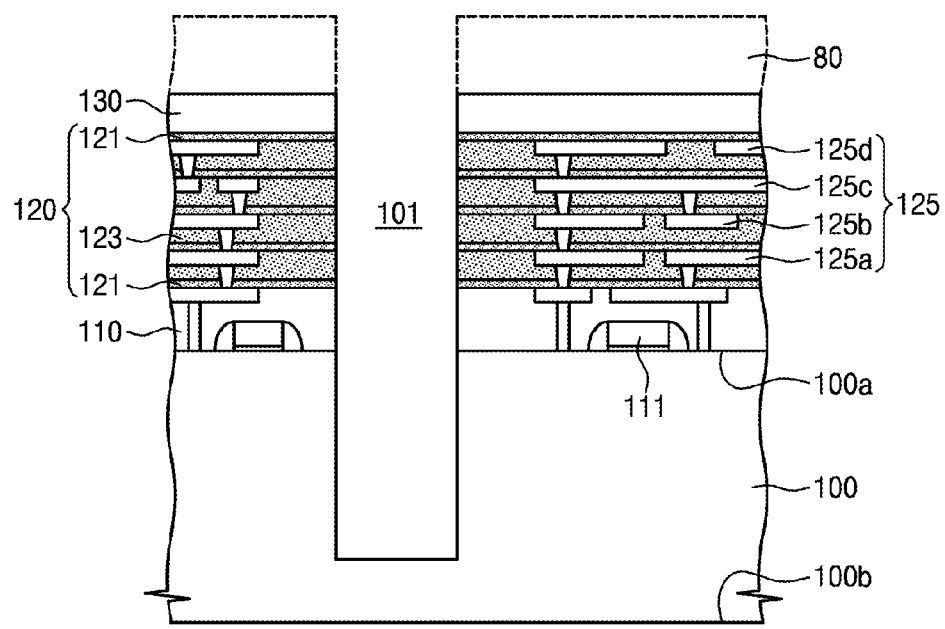

Referring to FIG. 1B, a via-hole 101 may be formed by an etching process using a mask layer 80 provided on the upper dielectric layer 130. For example, the mask layer 80 may be formed by coating and patterning a photoresist. The upper dielectric layer 130, the inter-metal dielectric layer 120, the interlayer dielectric layer 110, and the semiconductor substrate 110 may be patterned by a dry etching process using the mask layer 80, thereby forming the via-hole 101. A bottom surface of the via-hole 101 may not reach the bottom surface 100b of the semiconductor substrate 100. Sidewalls of the upper dielectric layer 130, the inter-metal dielectric layer 120 and the interlayer dielectric layer 110 may be exposed through the via-hole 101.

Figure 1C:
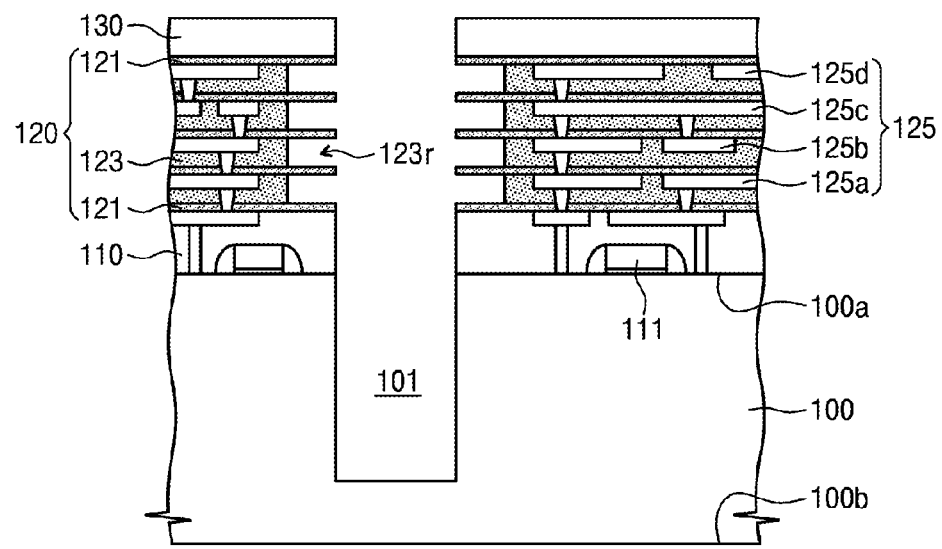

Referring to FIG. 1C, the exposed sidewall of the inter-metal dielectric layer 120 through the via-hole 101 may be selectively removed to form recess regions 123. In some embodiments, the recess regions 123r may be formed by a wet etching process using hydrofluoric acid (HF) as an etchant capable of selectively removing the low-k dielectric layers 123. The recess region 123r may extend in a horizontal direction parallel to the top surface 100a of the semiconductor substrate 100 between the capping layers 121 vertically adjacent to each other.

A depth (i.e., a length in the horizontal direction) of the recess region 123r may be varied depending on a condition of the wet etching process. For example, if a process time of the wet etching process is longer, the recess region 123r may have a greater depth. In contrast, if the process time of the wet etching process is shorter, the recess region 123r may have a smaller depth. Since the recess regions 123r are formed by the selective removal of the low-k dielectric layers 123, the recess regions 121 may have alcove-shapes which are spaced apart from each other with the capping layers 121 therebetween.

Figure 1D:
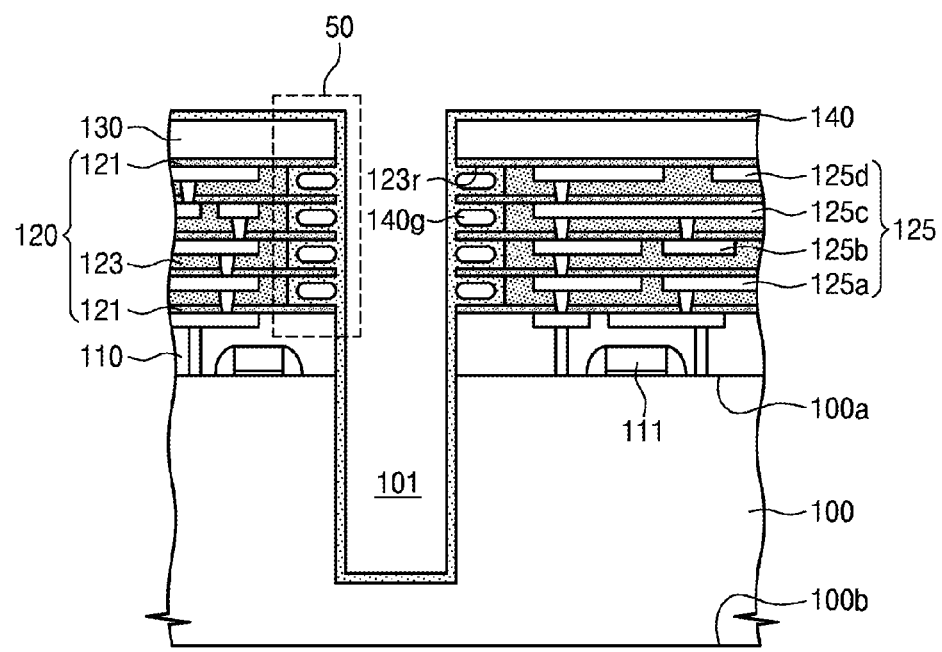
Figure 1E:
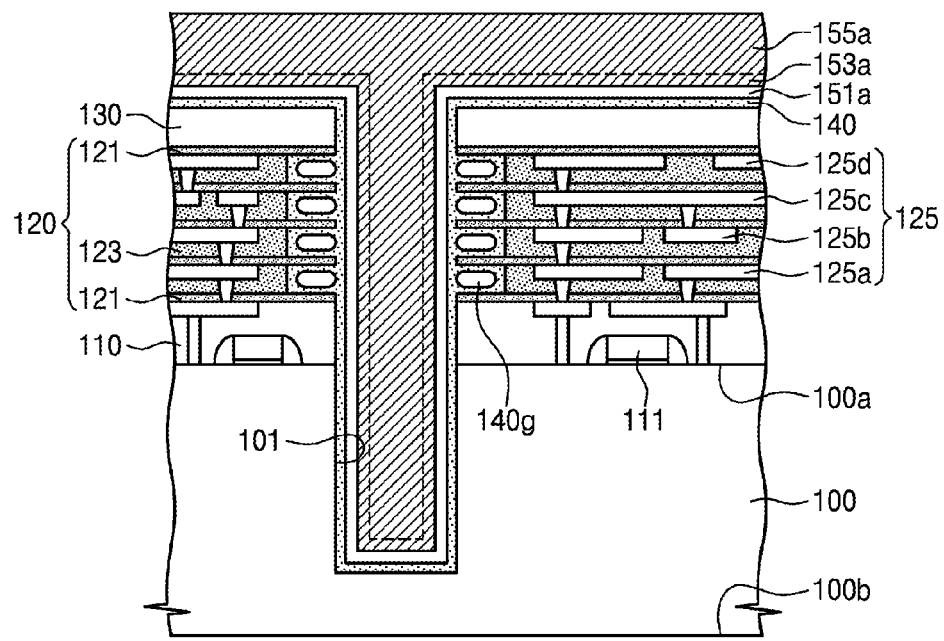

Referring to FIG. 1D, a via-dielectric layer 140 may be formed to cover an inner surface (e.g., an inner sidewall and a bottom surface) of the via-hole 101. For example, a silicon oxide layer may be deposited by a chemical vapor deposition (CVD) process to form the via-dielectric layer 140 covering the inner surface of the via-hole 101 and a top surface of the upper dielectric layer 130. In some embodiments, the via-dielectric layer 140 may partially fill the recess regions 123r. Since the via-dielectric layer 140 partially fills the recess regions 123r, the via-dielectric layer 140 may have a porous structure. In other words, voids 140g may be formed in the recess regions 123r. The voids 140g act as air-gaps as describe later with reference to FIG. 1I.

Thus, damage to the inter-metal dielectric layer 120 may be prevented. Sizes and shapes of the voids 140g may be the same as or similar to each other. Alternatively, the sizes and shapes of the voids 140g may be different from each other. The void 140g may also be hereinafter referred to as the air-gaps.

The formation of the voids 140g will be described in more detail with reference to FIGS. 2A to 2D which are enlarged views of a portion 50 of FIG. 1D.

Figure 2A:
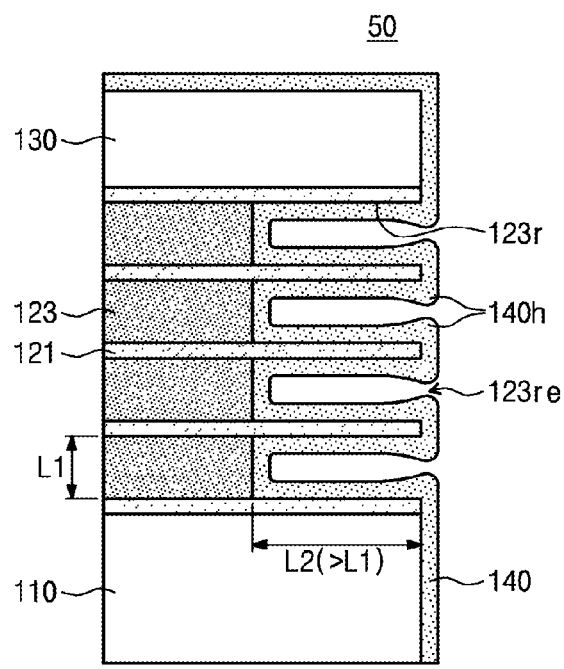
FIGS. 2A to 2D are cross-sectional views illustrating a method of forming an air-gap.

Referring to FIG. 2A, overhangs 140h may be formed on entrances 120re of the recess regions 123r when the via-dielectric layer 140 is deposited in the recess regions 123r. As the chemical vapor deposition process is performed, the via-dielectric layer 140 may become grown such that adjacent overhangs 140h may be combined with each other.

Figure 2B:
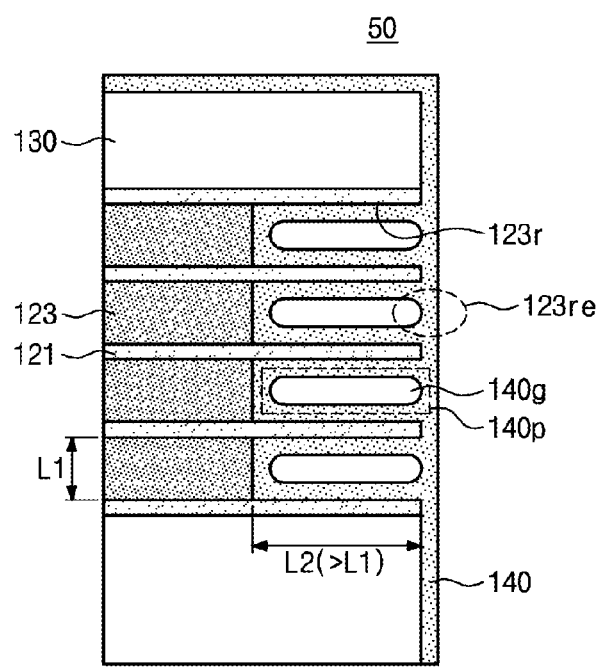

Referring to FIG. 2B, the entrance 123re may be closed by the combination of the overhangs 140h before the recess region 123r is completely filled with the via-dielectric layer 140. Thus, the via-dielectric layer 140 may be grown in the horizontal direction (e.g., right and left directions) to have a protrusion 140p inserted into the recess region 123r. The protrusion 140p of the via-dielectric layer 140 may include the void 140g, i.e., the air-gap. The void 140g may be in a vacuum state or may be filled with air. The voids 140g may be vertically spaced apart from each other with the capping layers 121 therebetween.

A size (or a volume) of the void 140g may be varied depending on an aspect ratio (L2/L1) of the recess region 123r. If the aspect ratio is great (i.e., if a horizontal length L2 of the recess region 123r is greater than a vertical length L1 of the recess region 123r), a time for which the recess region 123r is filled with the via-dielectric layer 140 may be longer than a time for which the adjacent overhangs 140h are combined with each other. As the aspect ratio decreases, the time for the recess region 123r to be filled with the via-dielectric layer 140 may become shorter. As a result, as the recess region 123r becomes deeper (i.e., as the aspect ratio of the recess region 123r increases), the size of the void 140g may increase.

Figure 2C:
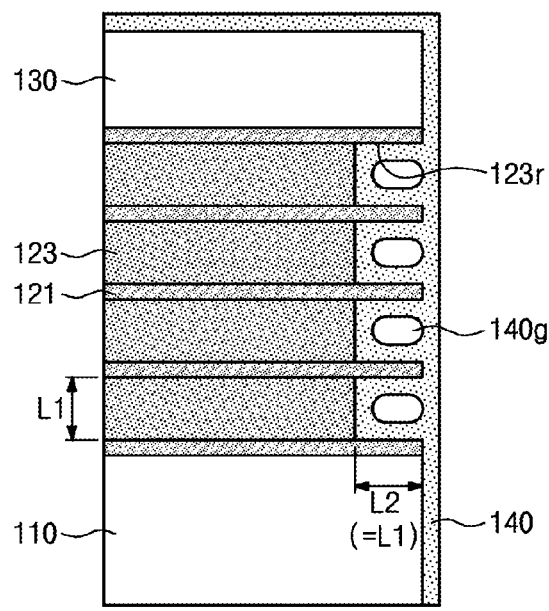
Figure 2D:
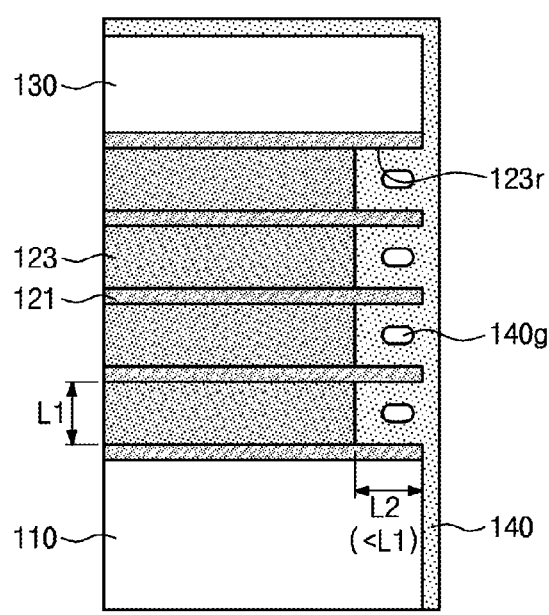

For example, if the vertical length L1 of the recess region 123r is equal to or similar to the horizontal length L2 of the recess region 123r as illustrated in FIG. 2C, the void 140g may have a smaller size than the void 140g of FIG. 2B. As illustrated in FIG. 2D, if the vertical length L1 of the recess region 123r is greater than the horizontal length L2 of the recess region 123r, the size of the void 140g may become more smaller.

In some embodiments, the condition of the wet etching process may be changed to control the depth of the recess region 123r. Thus, the size of the void 140g may be arbitrarily established.

Figure 2E:
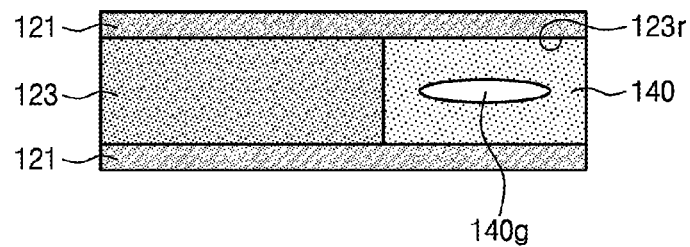
FIGS. 2E to 2I are cross-sectional views illustrating various shapes of an air-gap.
Figure 2F:
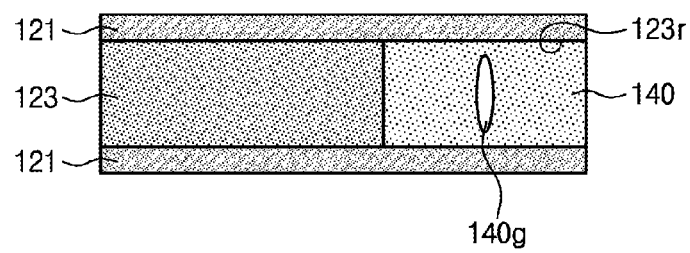
Figure 2G:
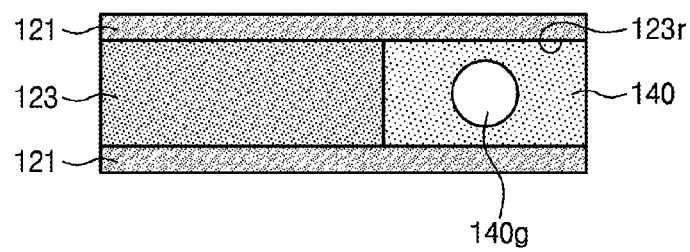
Figure 2H:
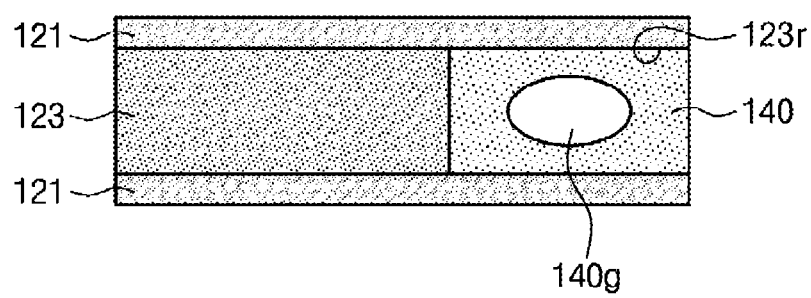
Figure 2I:
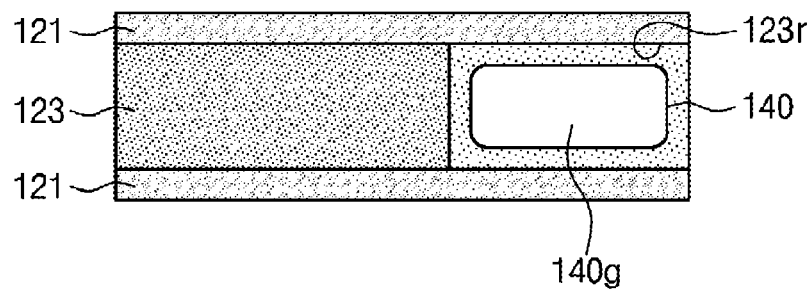

The void 140g may have various shapes. For example, the void 140g may have a long shape extending in the horizontal direction as illustrated in FIG. 2E or a long shape extending in a vertical direction as illustrated in FIG. 2F. In other embodiments, the void 140g may have a circular shape as illustrated in FIG. 2G or may have an elliptical shape as illustrated in FIG. 2H. In still other embodiments, the void 140g may have a quadrilateral shape which is the same as or similar to the recess region 123r, as illustrated in FIG. 2I.

Referring to FIG. IE, a conductive layer 155a may be formed on the semiconductor substrate 100 to fill the via-hole 101. The conductive layer 155a may be formed of at least one of poly-silicon, copper, tungsten, and aluminum by a deposition process or a plating process. If the conductive layer 155a is formed of copper or a conductive material including copper, a metal layer 151a capable of preventing diffusion of copper may be further formed on the via-dielectric layer 140. The metal layer 151a may be formed by depositing titanium (Ti), titanium nitride (TiN), chrome (Cr), tantalum (Ta), tantalum nitride (TaN), nickel (Ni), tungsten (W), tungsten nitride (WN), or any combination thereof. The metal layer 151a may extend along the via-dielectric layer 140.

In some embodiments, the conductive layer 155a may be formed by electroplating copper. For example, a seed layer 153a may be formed on the via-dielectric layer 140 or the metal layer 151a, and then the electroplating process may be performed using the seed layer 153a to form the conductive layer 155a. The seed layer 153a may be formed of, for example, copper or a metal including copper (e.g., copper-manganese (CuMn)) by a physical vapor deposition (PVD) process or a chemical vapor deposition (CVD) process.

After the formation of the conductive layer 155a, a planarization process may be performed to expose the upper dielectric layer 130 or the via-dielectric layer 140 formed on the upper dielectric layer 130. In some embodiments, a chemical mechanical polishing (CMP) process may be performed until the via-dielectric layer 140 on the upper dielectric layer 130 is exposed, thereby planarizing the conductive layer 155a.

Figure 1F:
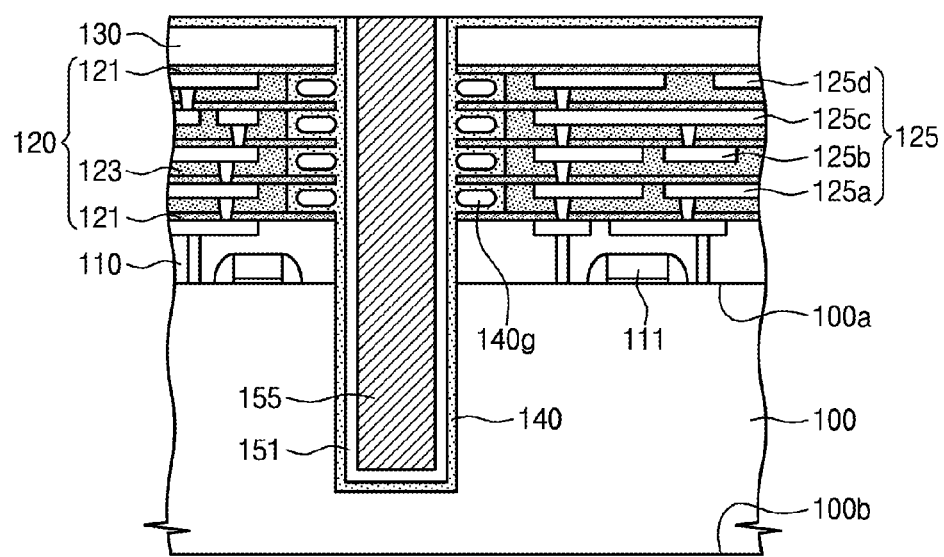

Referring to FIG. 1F, the conductive layer 155a may be transformed into a through-electrode 155 by the planarization process. The seed layer 153a may constitute a portion of the through-electrode 155. The through-electrode 155 may completely penetrate the upper dielectric layer 130, the inter-metal dielectric layer 120, and the interlayer dielectric layer 110 and may partially penetrate the semiconductor substrate 100.

The via-dielectric layer 140 may surround a sidewall and a bottom surface of the through-electrode 155 and may further extend onto the top surface of the upper dielectric layer 130. In other embodiments, if the upper dielectric layer 130 is used as a polishing stop layer during the chemical mechanical polishing process, the via-dielectric layer 140 may have a cup-shape surrounding the sidewall and the bottom surface of the through-electrode 155.

If the metal layer 151a is further formed, the metal layer 151a may be formed into a barrier layer 151 by the planarization process. The barrier layer 151 may prevent an element (e.g., copper) of the through-electrode 155 from being diffused into the semiconductor substrate 100 or the integrated circuit 111.

Figure 1G:
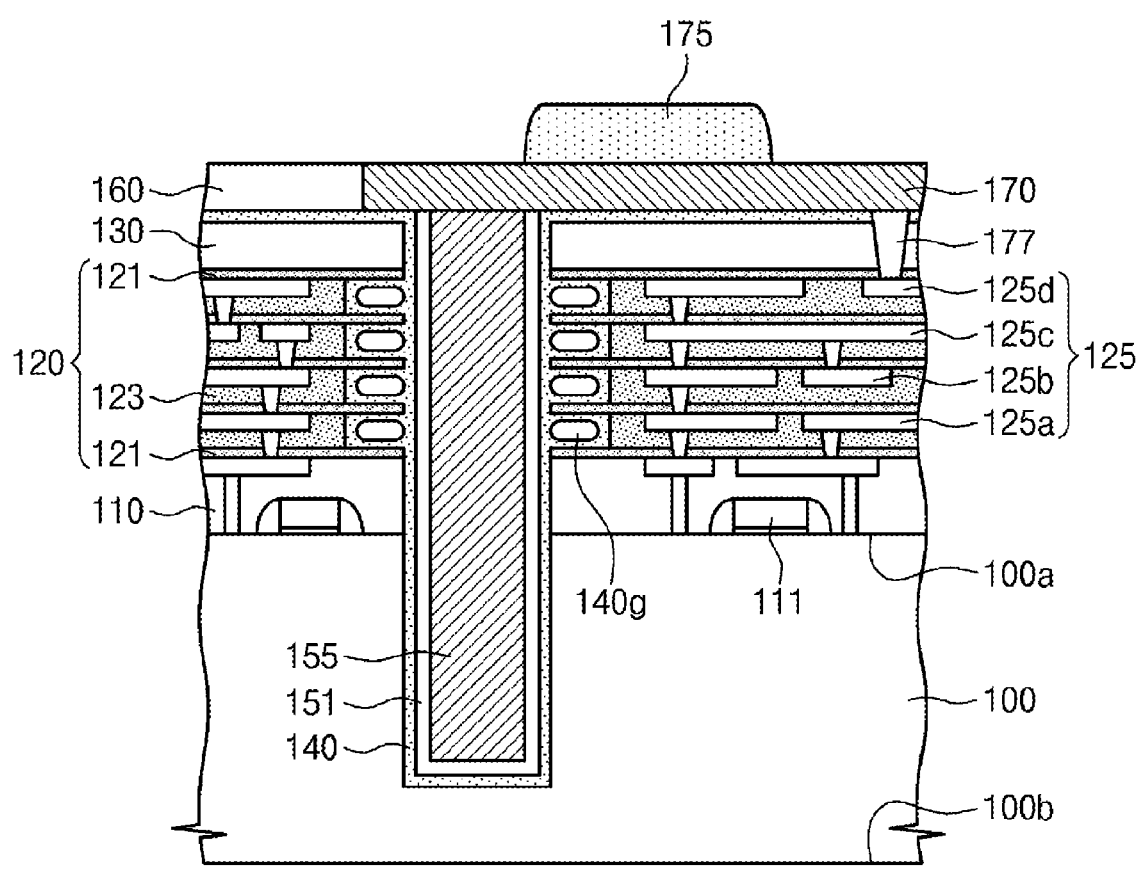

Referring to FIG. 1G, an upper interconnection 170 electrically connected to the through-electrode 155 may be formed on the semiconductor substrate 100. For example, the upper interconnection 170 contacting the through-electrode 155 may be formed on the upper dielectric layer 130 by using a deposition process or a damascene process. Alternatively, the upper interconnection 170 may be formed along with the through-electrode 155 by the electroplating process. The upper interconnection 170 may be electrically connected to the metal interconnection 125 (e.g., the fourth metal interconnection 125d) through a via-plug 177 penetrating the upper dielectric layer 130. Thus, the through-electrode 155 may be electrically connected to the integrated circuit 111 through the upper interconnection 170. A second upper dielectric layer 160 may be further formed on the semiconductor substrate 100. The second upper dielectric layer 160 may act as an electrical insulating layer between adjacent upper interconnections 170, and/or a passivation layer. In some embodiments, an upper terminal 175 may be formed on the upper interconnection 170. The upper terminal 175 may include a lead (Pb)-free solder.

Figure 1H:
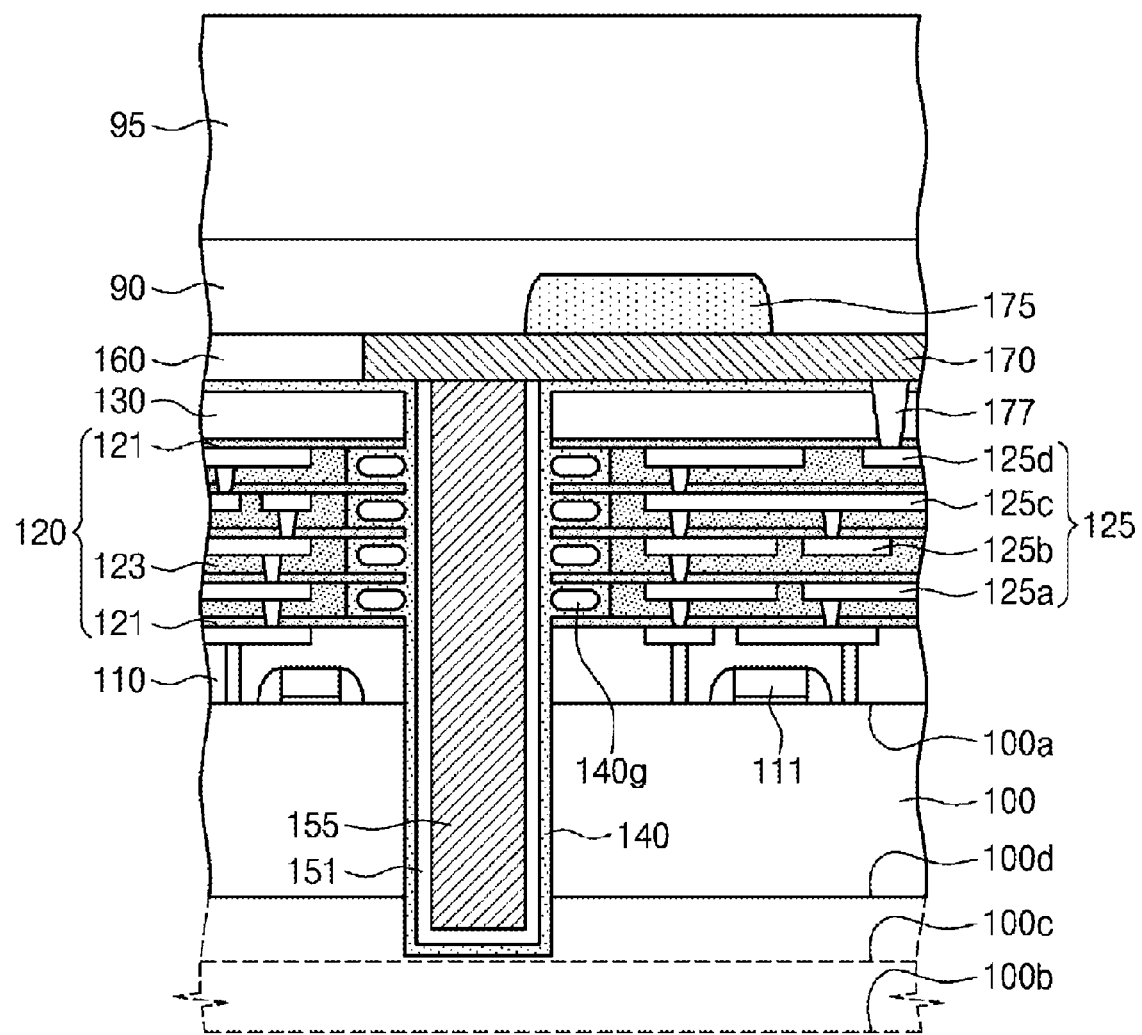

Referring to FIG. 1H, the semiconductor substrate 100 may be recessed until the through-electrode 155 protrudes. For example, the bottom surface 100b of the semiconductor substrate 100 may be recessed by at least one of a grinding process, a chemical mechanical polishing process and an etching process which use an etchant or slurry capable of selectively removing the material (e.g., silicon) of the semiconductor substrate 100. The recess process may be performed until a third bottom surface 100d is exposed. The third bottom surface 100d may be more adjacent to the top surface 100a than the bottom surface 100b, and the through-electrode 155 may protrude from the third bottom surface 100d. For example, the bottom surface 100b of the semiconductor substrate 100 may be chemically mechanically polished to emerge a second bottom surface 100c through which the through-electrode 155 is not exposed, and the second bottom surface 100c may be then dry-etched to reveal the third bottom surface 100d through which the through-electrode 155 is exposed.

A carrier 95 may be adhered to the top surface 100a of the semiconductor substrate 100 by an adhesive layer 90, and the protruding process of the through-electrode 155 may be then performed. The semiconductor substrate 100 may be overturned such that the bottom surface 100b faces upward. The protruding process may be performed under a condition that the bottom surface 100b faces upward. The top surface 100a may be hereinafter referred to as an active surface, and the third bottom surface 100d may be hereinafter referred to as an inactive surface.

Figure 1I:
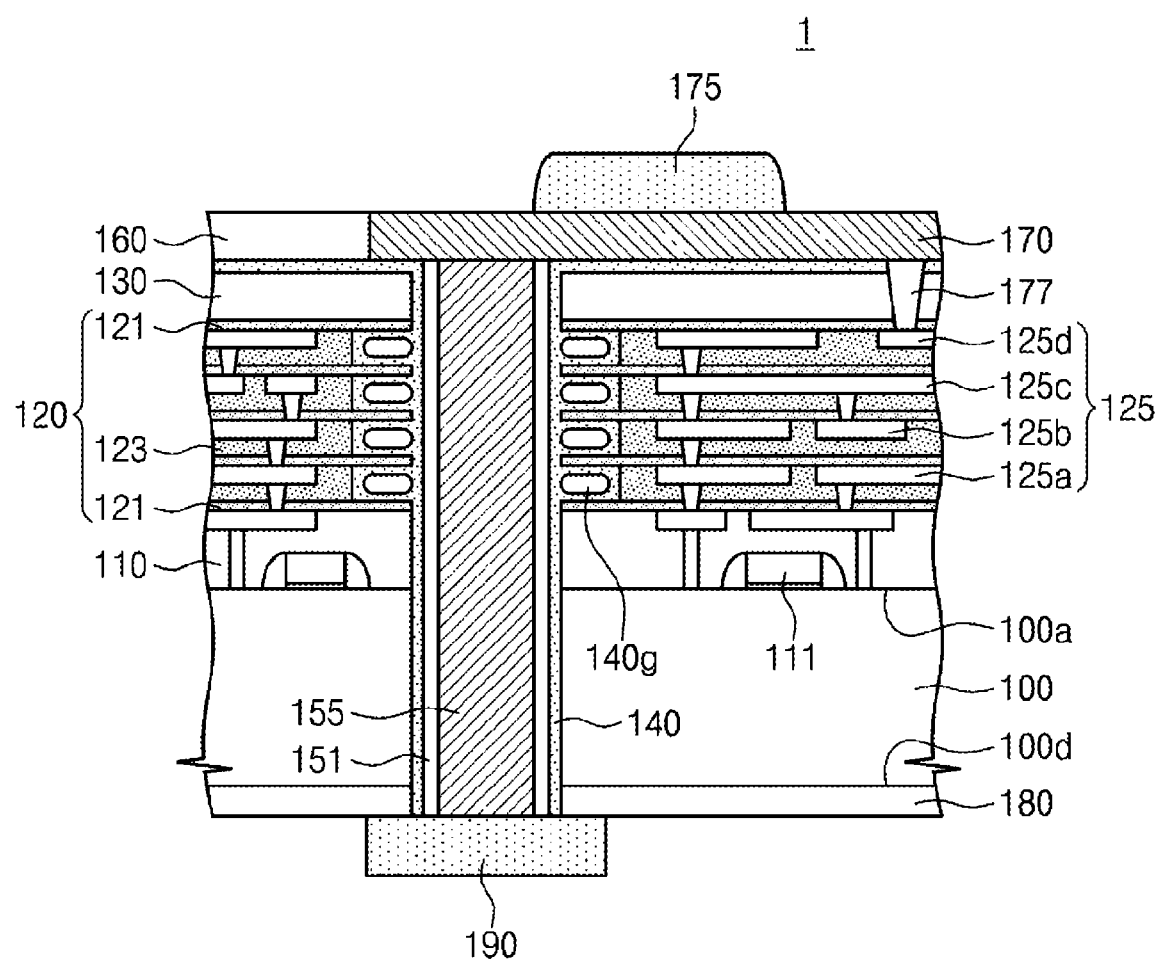
Figure 1J:
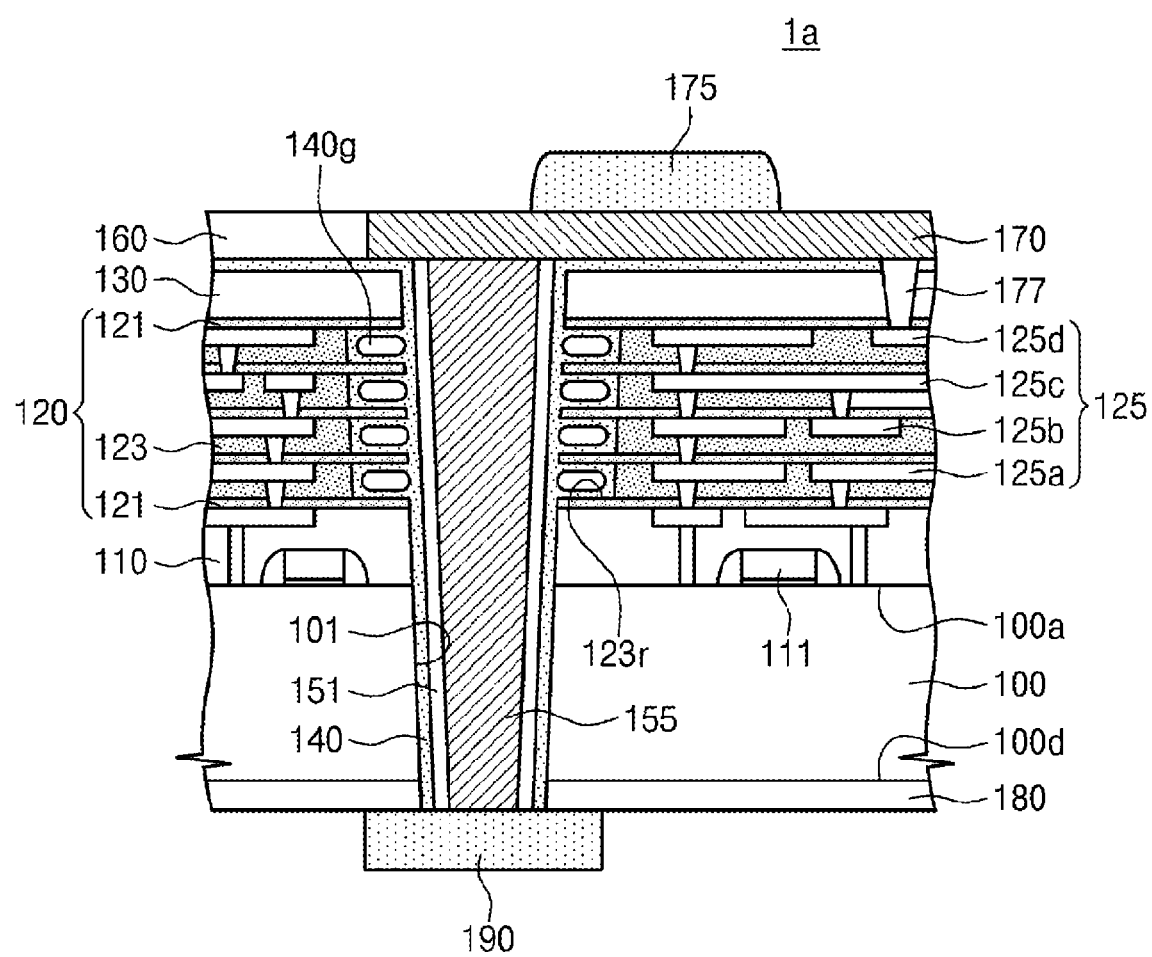
FIG. 1J is a cross-sectional view illustrating a modified embodiment of FIG. 1I.

Referring to FIG. 1I, a lower dielectric layer 180 may be formed on the inactive surface 100d of the semiconductor substrate 100. In some embodiments, a silicon oxide layer or silicon nitride layer may be deposited on the inactive surface 100d so as to cover the through-electrode 155, and a chemical mechanical polishing process may be then performed on the silicon oxide layer or silicon nitride layer to form a planarized lower dielectric layer 180. The through-electrode 155 may be exposed through the lower dielectric layer 180. A lower terminal 190 may be formed on the lower dielectric layer 180. The lower terminal 190 may be electrically connected to the through-electrode 155. The lower terminal 190 may have a pad-shape or a solder ball-shape. A semiconductor device 1 including the through-electrode 155 surrounded by the via-dielectric layer 140 having the air-gaps 140g may be fabricated by the series of the processes described above.

In other embodiments, a semiconductor device 1a having a tapered through-electrode 155 may be fabricated as illustrated in FIG. 1J. For example, the via-hole 101 may be formed to have a horizontal cross-sectional area which becomes progressively less toward the inactive surface 100d of the semiconductor substrate 100. Thus, the through-electrode 155 may have a tapered shape of which a horizontal cross-sectional area becomes progressively less toward its bottom surface. Additionally, the recess regions 123r having the air-gaps 140g may progressively back in a lateral direction as a distance from the active surface 100a increases.

The low-k dielectric layers 123 constituting the inter-metal dielectric layer 120 may reduce parasitic capacitances between the first to fourth metal interconnections 125a to 125d. Thus, it is possible to reduce or prevent data error caused by noise, delay, and loss of electrical signals transmitted through the first to fourth metal interconnections 125a to 125d.

The low-k dielectric layers 123 may have mechanical strength weaker than that of silicon dioxide (SiO2) composing the interlayer dielectric layer 110 and/or the upper dielectric layer 130. Thus, the low-k dielectric layers 123 may be damaged by expansion of the through-electrode 155 or thermal stress. For example, cracks may occur in the low-k dielectric layers 123, the low-k dielectric layers 123 may be broken, and/or the low-k dielectric layers 123 may be peeled from the capping layers 121. In some embodiments, the low-k dielectric layers 123 have the air-gaps 140g. The air-gaps 140g may buffer or prevent the mechanical stress and/or the thermal stress. Thus, the damage to the low-k dielectric layers 123 may be substantially minimized or prevented.

Second Embodiment

FIGS. 3A to 3I are cross-sectional views illustrating a method for fabricating a semiconductor device according to other embodiments of the inventive concepts. FIG. 3J is a cross-sectional view illustrating a modified embodiment of FIG. 3I.

Figure 3A:
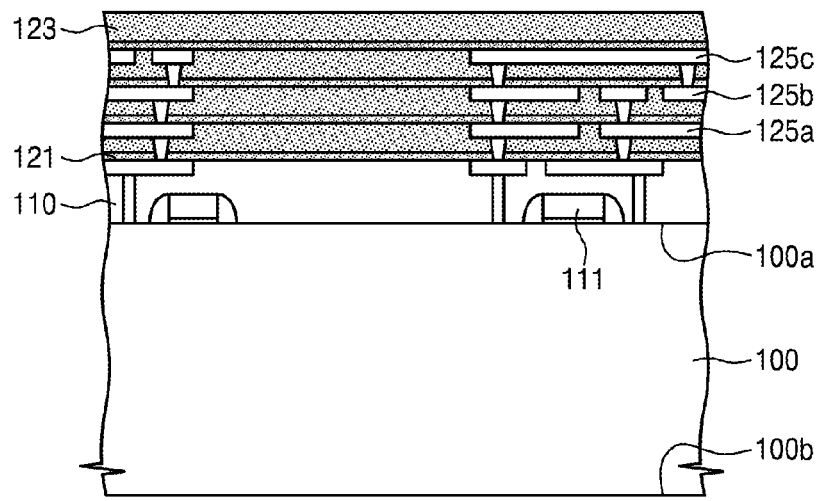
FIGS. 3A to 3I are cross-sectional views illustrating a method for fabricating a semiconductor device according to other embodiments of the inventive concepts.

Referring to FIG. 3A, an interlayer dielectric layer 110 including an integrated circuit 111 may be formed on an active surface 100a of a semiconductor substrate 100, and a capping layer 121 and a low-k dielectric layer 123 may be repeatedly and alternately stacked on the interlayer dielectric layer 110. The low-k dielectric layers 123 may include first to third metal interconnections 125a to 125c. An uppermost layer of the stacked layers on the semiconductor substrate 100 may be the low-k dielectric layer 123 or the capping layer 121. In some embodiments, the uppermost layer being the low-k dielectric layer 123 will be described as an example. However, features of the present embodiment may be applied to a semiconductor device including the uppermost layer which is the capping layer 121.

Figure 3B:
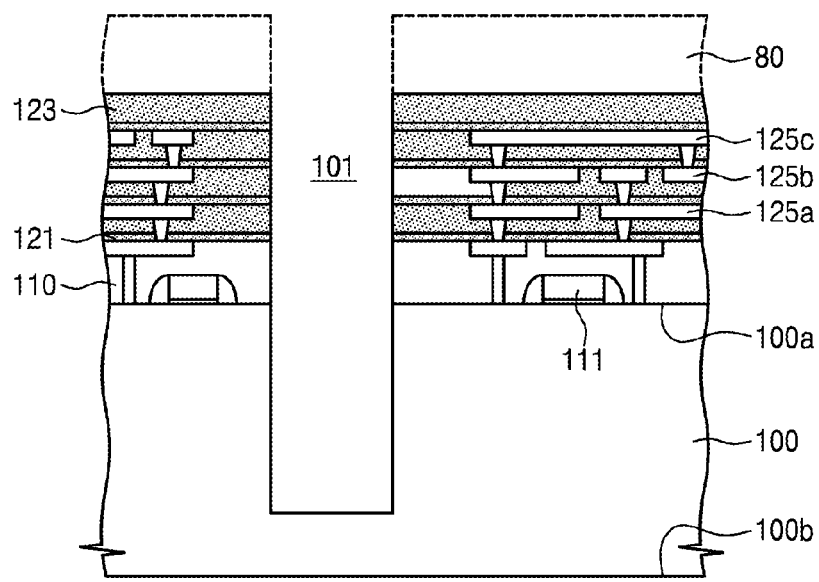

Referring to FIG. 3B, a mask layer 80 may be formed on the uppermost low-k dielectric layer 123, and a dry etching process using the mask layer 80 may be performed to form a via-hole 101. The via-hole 101 may not reach a bottom surface 100b of the semiconductor substrate 100.

Figure 3C:
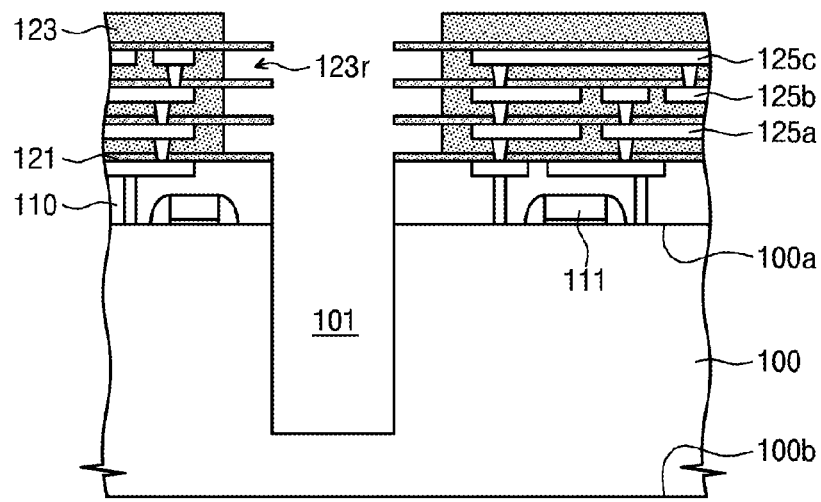

Referring to FIG. 3C, sidewalls, which is exposed through the via-hole 101, of the low-k dielectric layers 123 may be selectively removed by a wet etching process using, for example, hydrofluoric acid (HF) as an etchant. Thus, recess regions 123r vertically spaced apart from each other may be formed between the capping layers 121.

Figure 3D:
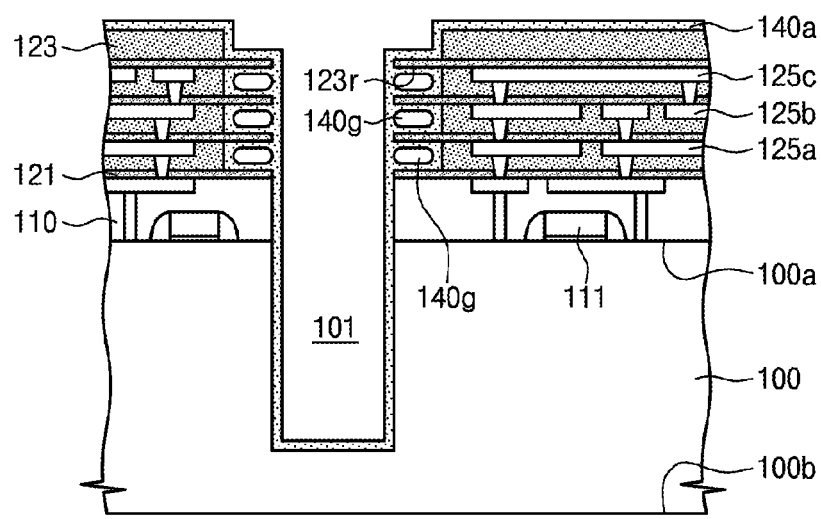

Referring to FIG. 3D, a dielectric layer 140a may be formed to cover an inner surface of the via-hole 101. The dielectric layer 140a may partially fill the recess regions 123r. As described above with reference to FIGS. 2A and 2B, since the recess regions 123r are not completely filled with the dielectric layer 140a, air-gaps 140g may be formed in the recess regions 123r.

Figure 3E:
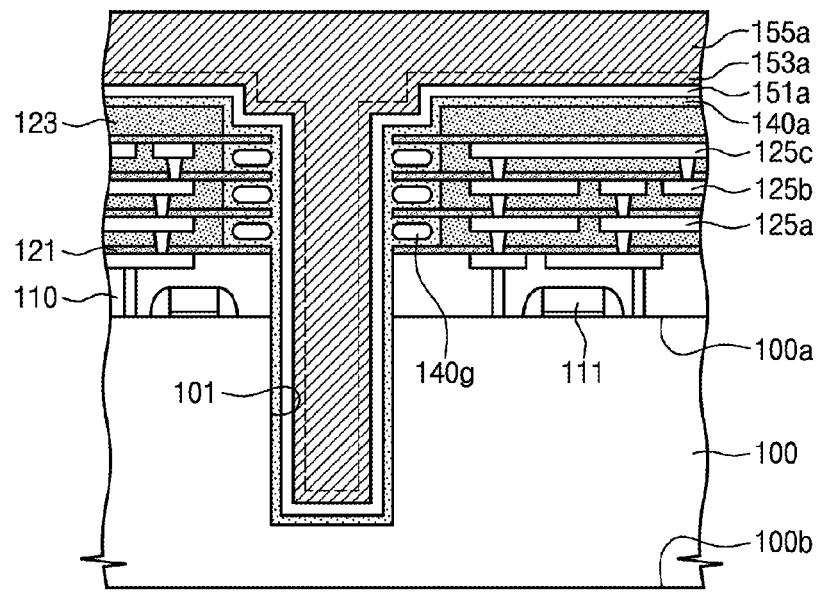

Referring to FIG. 3E, a conductive layer 155a including, for example, copper may be formed to fill the via-hole 101 on the semiconductor substrate 100 by an electroplating process using a seed layer 153a. A metal layer 151a capable of preventing diffusion of copper may be further formed before the formation of the conductive layer 155a. After the formation of the conductive layer 155a, a chemical mechanical polishing process may be performed to planarize the conductive layer 155a, the metal layer 151a, and the dielectric layer 140a. The planarization process may be performed until an uppermost capping layer 121 is exposed.

Figure 3F:
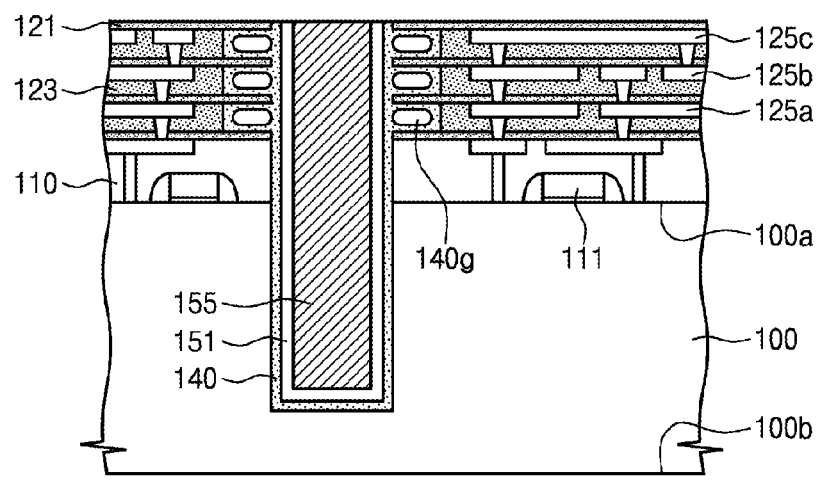

Referring to FIG. 3F, by the planarization process, the conductive layer 155a, the metal layer 151a, and the dielectric layer 140a may be formed into a through-electrode 155, a barrier layer 151, and a via-dielectric layer 140, respectively. The via-dielectric layer 140 may have a cup-shape surrounding a sidewall and a bottom surface of the through-electrode 155 and may have a porous shape including the air-gaps 140g.

Figure 3G:
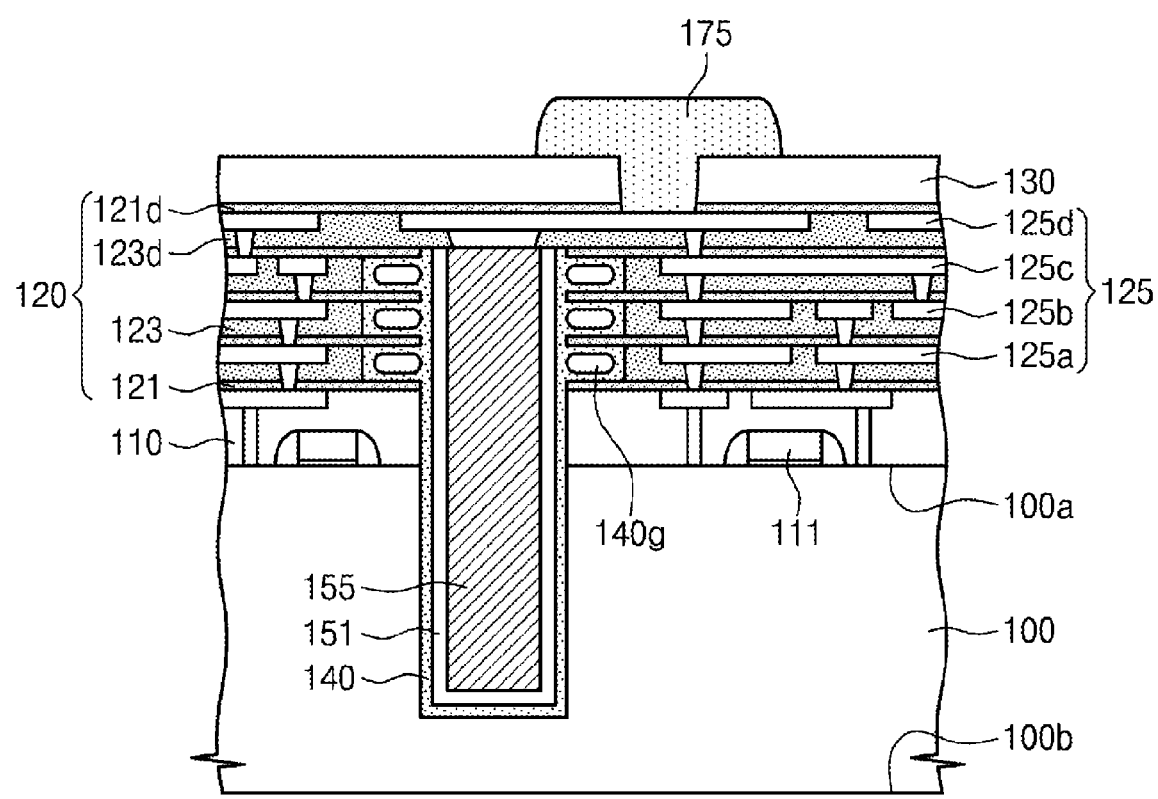

Referring to FIG. 3G, a fourth metal interconnection 125d and a low-k dielectric layer 123d may be formed on the semiconductor substrate 100. The fourth metal interconnection 125d may be electrically connected to the through-electrode 155 and may be formed in the low-k dielectric layer 123d. An upper dielectric layer 130 may be formed on the fourth metal interconnection 125d, and a capping layer 121d may be formed between the upper dielectric layer 130 and the low-k dielectric layer 123d. The fourth metal interconnection 125d may be connected to the third metal interconnection 125c to electrically connect the through-electrode 155 to the integrated circuit 111. The first to fourth metal interconnections 125a to 125d may constitute a metal interconnection 125 having a multi-layered structure (e.g., a four-layered structure). The low-k dielectric layers 123 and 123d and the capping layers 121 and 121d may constitute an inter-metal dielectric layer 120.

An upper terminal 175 may be formed on the upper dielectric layer 130. The upper terminal 175 may penetrate the upper dielectric layer 130 so as to be electrically connected to the fourth metal interconnection 125d. Alternatively, the upper terminal 174 may be formed in a redistribution pad shape.

Figure 3H:
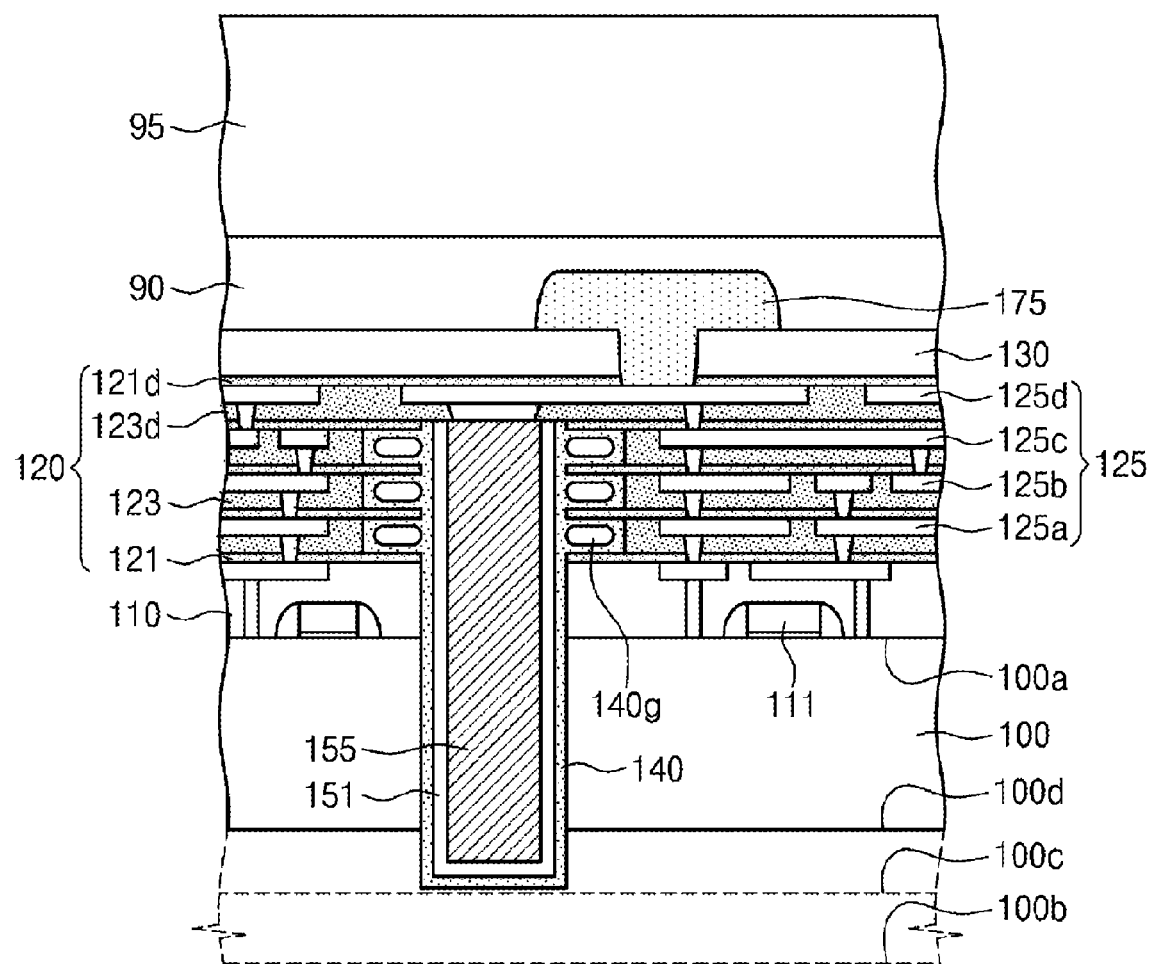

Referring to FIG. 3H, a carrier 95 may be adhered to the active surface 100a of the semiconductor substrate 100 by an adhesive layer 90, and the bottom surface 100b of the semiconductor substrate 100 may be then recessed to protrude the through-electrode 155. In some embodiments, the bottom surface 100b of the semiconductor substrate 100 may be chemically mechanically polished to emerge a second bottom surface 100c through which the through-electrode 155 is not exposed, and the second bottom surface 100c may be dry-etched to expose an inactive surface 100d through which the through-electrode 155 is protruded.

Figure 3I:
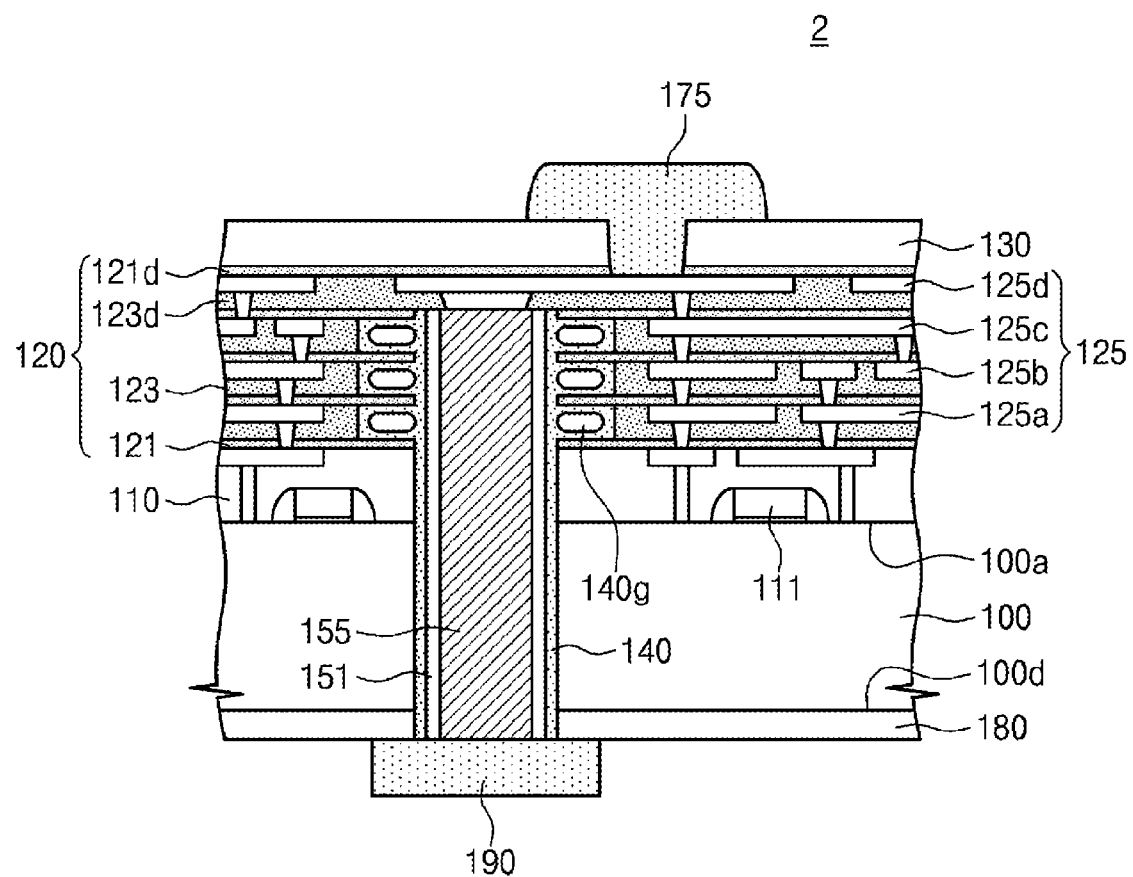
Figure 3J:
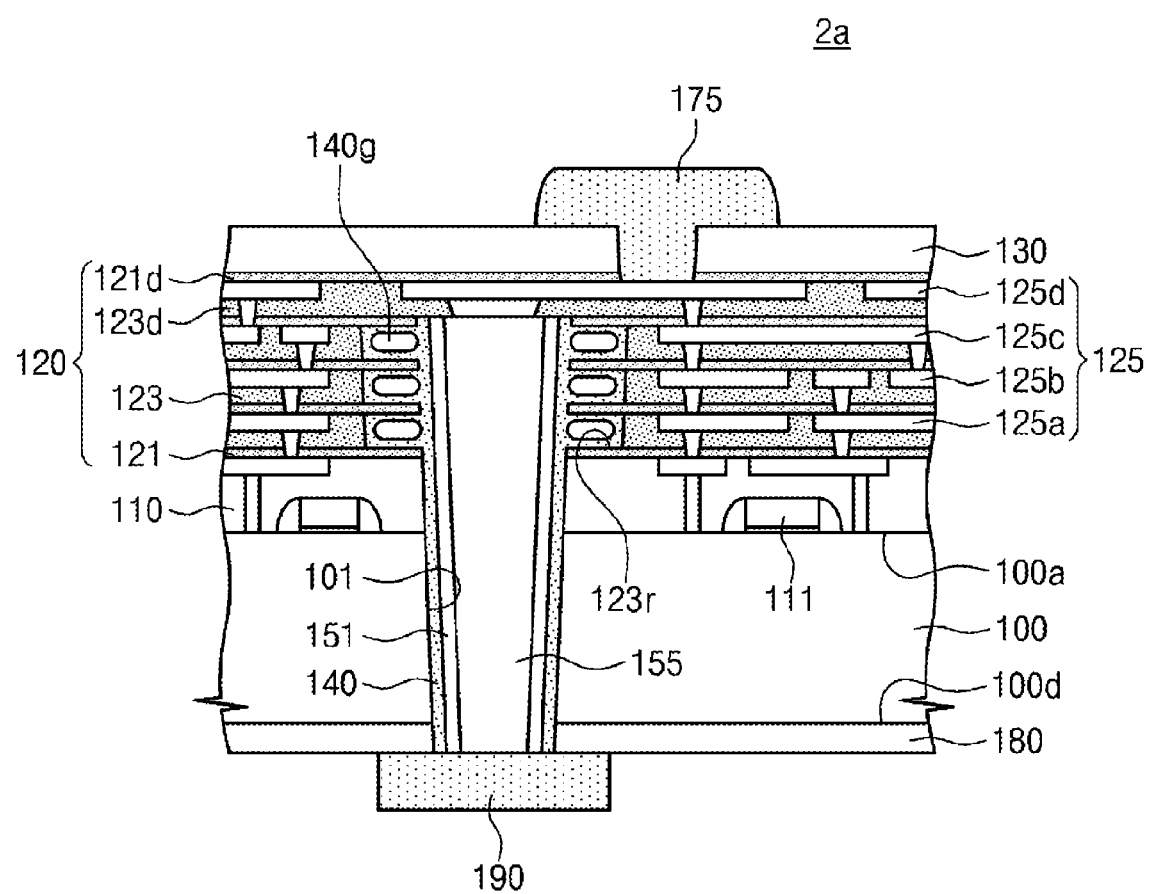
FIG. 3J is a cross-sectional view illustrating a modified embodiment of FIG. 3I.

Referring to FIG. 3I, a silicon oxide layer or silicon nitride layer may be deposited to cover the through-electrode 155 on the inactive surface 100d of the semiconductor substrate 100, and a chemical mechanical polishing process may be then performed on the deposited silicon oxide layer or silicon nitride layer to form a planarized lower dielectric layer 180. A lower terminal 190 electrically connected to the through-electrode 155 may be formed on the lower dielectric layer 180. The lower terminal 190 may have a pad-shape or a solder ball-shape. A semiconductor device 2 including the through-electrode 155 surrounded by the via-dielectric layer 140 having the air-gaps 140g may be fabricated by the processes described above.

Alternatively, as illustrated in FIG. 3J, a horizontal cross-sectional area of a via-hole 101 may become progressively less toward the inactive surface 100d of the semiconductor substrate 100. Thus, a semiconductor device 2a having a tapered through-electrode 155 may be fabricated. The recess regions 123r having the air-gaps 140g may progressively back in a lateral direction as a distance from the active surface 100a increases.

Applications

Figure 4A:
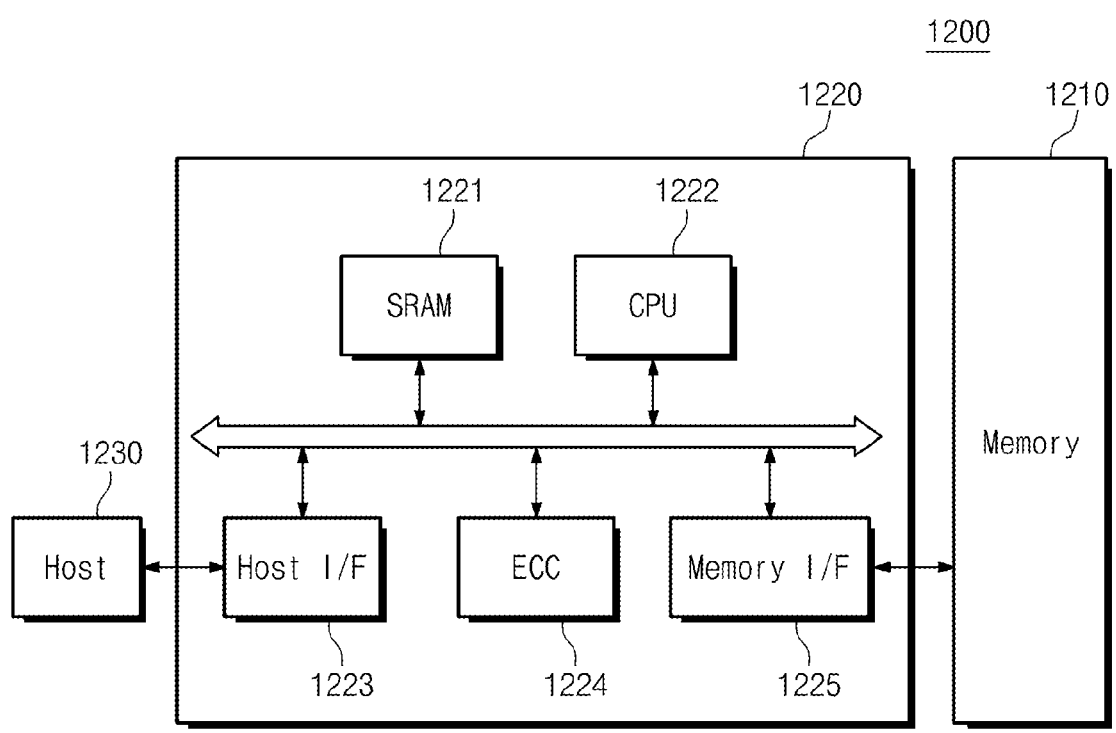
FIG. 4A is a schematic block diagram illustrating a memory card including a semiconductor device according to embodiments of the inventive concepts.

FIG. 4A is a schematic block diagram illustrating a memory card including a semiconductor device according to embodiments of the inventive concepts.

Referring to FIG. 4A, a memory device 1210 including at least one of the semiconductor devices 1, 1a, 2 and 2a in the aforementioned embodiments may be applied to a memory card 1200. For example, the memory card 1200 may include a memory controller 1220 that controls data communication between a host 1230 and the memory device 1210. A static random access memory (SRAM) device 1221 may be used as an operation memory of a central processing unit (CPU) 1222. A host interface unit 1223 may be configured to include a data communication protocol between the memory card 1200 and the host 1230. An error check and correction (ECC) block 1224 may detect and correct errors of data which are read out from the memory device 1210. A memory interface unit 1225 may interface with the memory device 1210. The CPU 1222 controls overall operations of the memory controller 1220. The CPU 1222 may include at least one of the semiconductor devices 1, 1a, 2 and 2a according to the aforementioned embodiments of the inventive concepts.

Figure 4B:
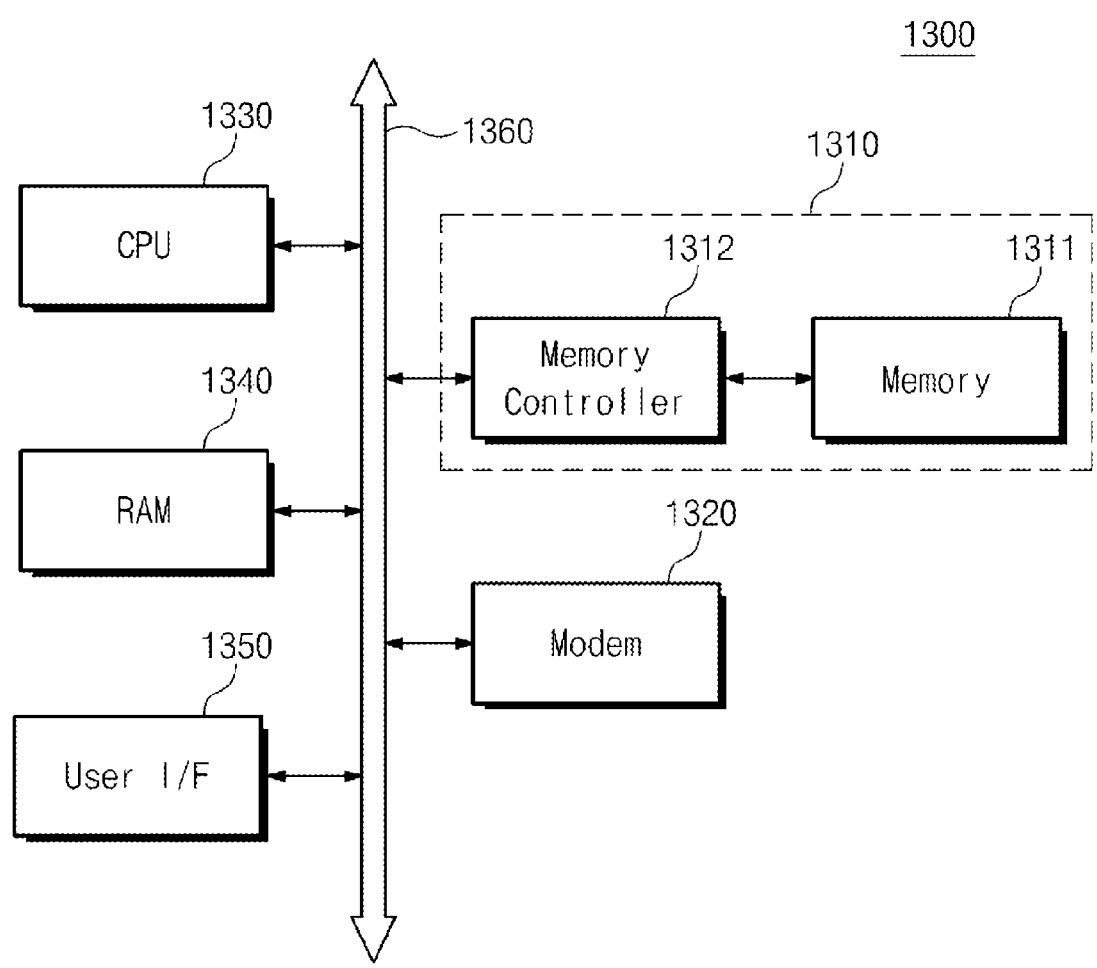
FIG. 4B is a schematic block diagram illustrating an information processing system applied with a semiconductor device according to embodiments of the inventive concepts.

FIG. 4B is a schematic block diagram illustrating an information processing system applied with a semiconductor device according to embodiments of the inventive concepts.

Referring to FIG. 4B, an information processing system 1300 may include a memory system 1310 including at least one of the semiconductor devices 1, 1a, 2 and 2a according to embodiments of the inventive concepts. The information processing system 1300 may include a mobile device or a computer. For example, the information processing system 1300 may include a modem 1320, a central processing unit (CPU) 1330, a random access memory (RAM) 1340, and a user interface unit 1350 that are electrically connected to the memory system 1310 through a system bus 1360. The memory system 1310 may include a memory device 1311 and a memory controller 1312. The memory system 1310 may have substantially the same structure as the memory card 1200 illustrated FIG. 4A. At least one of the CPU 1330 and the RAM 1340 may include at least one of the semiconductor devices 1, 1a, 2 and 2a according to embodiments of the inventive concepts.

The memory system 1310 may store data processed by the CPU 1330 or data inputted from an external system. The information processing system 1300 may be realized as a memory card, a solid state disk (SSD) device, a camera image sensor, and another type of application chipset. For example, if the memory system 1310 may be realized as the SSD device, the information processing system 1300 may stably and reliably store massive data.

According to embodiments of the inventive concepts, the air-gaps are included in the via-dielectric layer. The air-gaps may buffer or prevent the mechanical and/or thermal stress applied to the low-k dielectric layers including the metal interconnections. Thus, mechanical endurance and electrical characteristics of the semiconductor device may be improved.

While the inventive concepts have been described with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A semiconductor device comprising:
a semiconductor substrate having a top surface and a bottom surface disposed on an opposite side of the semiconductor substrate from the top surface;
an interlayer dielectric layer provided on the top surface of the semiconductor substrate, the interlayer dielectric layer including an integrated circuit;
an inter-metal dielectric layer provided on the interlayer dielectric layer, the inter-metal dielectric layer including at least one metal interconnection electrically connected to the integrated circuit, the inter-metal dielectric layer including a plurality of low-k dielectric layers and a plurality of insulating capping layers, each of the plurality of low-k dielectric layers and each of the plurality of insulating capping layers being alternately stacked on the interlayer dielectric layer in a first direction perpendicular to the top surface of the semiconductor substrate;
an upper dielectric layer disposed on the inter-metal dielectric layer;
a through-electrode penetrating the inter-metal dielectric layer, the interlayer dielectric layer, and the semiconductor substrate;
a via-dielectric layer surrounding an outer surface of the through-electrode, the via-dielectric layer electrically insulating the through-electrode from the semiconductor substrate,
wherein the via-dielectric layer includes a body and a plurality of protrusions,
wherein the body of the via-dielectric layer is extended in the first direction along a sidewall of the through-electrode,
wherein each of the plurality of protrusions is extended in a second direction crossing the first direction from the body toward one of the plurality of the low-k dielectric layers,
wherein each of the plurality of protrusions is simultaneously in contact with a sidewall of each of the plurality of the low-k dielectric layers and a bottom surface of each of the plurality of the insulating capping layers, and
wherein each of the plurality of protrusions and each of the plurality of insulating capping layers are alternately stacked in the first direction on the top surface of the semiconductor substrate; and
a barrier layer between the through-electrode and the via-dielectric layer.

2. The semiconductor device of claim 1,
wherein the through-electrode fills a via-hole penetrating the inter-metal dielectric layer, the interlayer dielectric layer, and the semiconductor substrate, and
wherein the body of the via-dielectric layer extends along an inner sidewall of the via-hole.

3. The semiconductor device of claim 2, further comprising:
a plurality of air-gaps, each of the plurality of air-gaps being surrounded by one of the plurality of protrusions,
wherein each of the plurality of protrusions inserted into a space between two adjacent insulating capping layers of the plurality of insulating capping layers.

4. The semiconductor device of claim 3,
wherein the plurality of low-k dielectric layers has a dielectric constant lower than that of silicon dioxide, and
wherein the protrusions protrude toward the low-k dielectric layers in the second direction.

5. The semiconductor device of claim 4,
wherein the air-gaps are spaced apart from each other with the insulating capping layers therebetween in the first direction.

6. The semiconductor device of claim 1, further comprising:
an upper interconnection disposed on the upper dielectric layer,
wherein the through-electrode further penetrates the upper dielectric layer and is connected to the upper interconnection.

7. The semiconductor device of claim 1, further comprising:
an upper terminal disposed on the upper dielectric layer,
wherein the upper terminal penetrates the upper dielectric layer and is connected to the metal interconnection electrically connected to the through-electrode.

8. The semiconductor device of claim 1, further comprising:
a plurality of air-gaps, each of the plurality of air-gaps being surrounded by one of the plurality of protrusions,
wherein the plurality of low-k dielectric layers has a dielectric constant lower than that of silicon dioxide, and
wherein the low-k dielectric layers include recess regions extending from the via-dielectric layer in the second direction.

9. The semiconductor device of claim 8,
wherein the recess regions are partially filled with the via-dielectric layer, and
wherein the plurality of air-gaps is defined by spaces incompletely filled with the via-dielectric layer in the recess regions.

10. The semiconductor device of claim 8,
wherein the recess regions are spaced apart from each other with the insulating capping layers therebetween in the first direction.

11. A semiconductor device comprising:
a semiconductor substrate having a top surface and a bottom surface disposed on an opposite side of the semiconductor substrate from the top surface;
an interlayer dielectric layer provided on the top surface of the semiconductor substrate, the interlayer dielectric layer including an integrated circuit;
an inter-metal dielectric layer provided on the interlayer dielectric layer, the inter-metal dielectric layer including at least one metal interconnection electrically connected to the integrated circuit;
a through-electrode penetrating the inter-metal dielectric layer, the interlayer dielectric layer, and the semiconductor substrate;
a via-dielectric layer surrounding the through-electrode, the via-dielectric layer electrically insulating the through-electrode from the semiconductor substrate; and
a barrier layer between the through-electrode and the via-dielectric layer,
wherein the via-dielectric layer includes a porous dielectric layer including one or more voids between the inter-metal dielectric layer and the through-electrode,
wherein the inter-metal dielectric layer includes:
a plurality of low-k dielectric layers stacked on the interlayer dielectric layer in a first direction perpendicular to the top surface of the semiconductor substrate; and
a plurality of insulating capping layers provided between the plurality of low-k dielectric layers, wherein the voids are disposed in the via-dielectric layer and disposed between two adjacent insulating capping layers among the plurality of insulating capping layers, wherein the voids and the plurality of insulating capping layers are overlapped in the first direction, and wherein the via-dielectric layer is simultaneously in contact with a sidewall of each of the plurality of the low-k dielectric layers and a bottom surface of each of the plurality of the insulating capping layers.

12. The semiconductor device of claim 11,
wherein the plurality of low-k dielectric layers has a dielectric constant lower than that of silicon dioxide.

13. The semiconductor device of claim 1,
wherein the via-dielectric layer is extended to be in contact with a top surface of the upper dielectric layer.

14. The semiconductor device of claim 11, further comprising:

an upper dielectric layer disposed on the inter-metal dielectric layer, wherein the via-dielectric layer is extended to be in contact with a top surface of the upper dielectric layer.

* * * * *